US011212936B2

(12) United States Patent
Johnson et al.

(10) Patent No.: US 11,212,936 B2
(45) Date of Patent: Dec. 28, 2021

(54) POWER CONNECTOR FOR ELECTRONIC EQUIPMENT SUPPORTED BY A RACK ASSEMBLY

(71) Applicant: ABB Schweiz AG, Baden (CH)

(72) Inventors: Mark Allen Johnson, Plano, TX (US); Edward Clark Fontana, Rockwall, TX (US); Charles Edward Higby, Lewisville, TX (US)

(73) Assignee: ABB Power Electronics Inc., Plano, TX (US)

( * ) Notice: Subject to any disclaimer, the term of this patent is extended or adjusted under 35 U.S.C. 154(b) by 0 days.

(21) Appl. No.: 16/186,583

(22) Filed: Nov. 12, 2018

(65) Prior Publication Data
US 2019/0082553 A1 Mar. 14, 2019

Related U.S. Application Data

(62) Division of application No. 15/290,488, filed on Oct. 11, 2016, now Pat. No. 10,130,000.

(51) Int. Cl.
H01R 13/62 (2006.01)
H05K 7/14 (2006.01)
H01R 13/631 (2006.01)
H01R 25/14 (2006.01)

(52) U.S. Cl.
CPC ....... H05K 7/1492 (2013.01); H01R 13/6315 (2013.01); H01R 25/142 (2013.01)

(58) Field of Classification Search
CPC ............ H01R 13/193; H01R 13/62933; H01R 23/7068; H01R 13/6315; H01R 25/142; G06F 1/184; G06F 1/187; G06F 1/186; H05K 5/0021; H05K 7/1492

USPC .................. 439/259, 261, 310, 924.1, 928.1; 361/679.31, 679.33, 732, 801
See application file for complete search history.

(56) References Cited

U.S. PATENT DOCUMENTS 4,540,227 A * 9/1985 Faraci .................. H01R 13/193
439/260
4,821,145 A * 4/1989 Corfits ................. H05K 7/1461
361/692
4,934,941 A 6/1990 Okada
(Continued)

FOREIGN PATENT DOCUMENTS

CN 1623351 A 6/2005
CN 103562817 A 2/2014
(Continued)

OTHER PUBLICATIONS

Cisco Quick Start Guide for Cisco ASR 1004 Router, 2010, 40 pages.
(Continued)

Primary Examiner — Thanh Tam T Le
(74) Attorney, Agent, or Firm — Armstrong Teasdale LLP

(57) ABSTRACT

A power connector includes an outer casing couplable to a chassis such that the outer casing is positioned between sides of the chassis. The power connector also includes a body movably coupled to the outer casing. The body is movable between a first position and a second position. The body extends beyond the outer casing when in the first position. The body positioned entirely within the outer casing when in the second position.

24 Claims, 10 Drawing Sheets

(56) References Cited

U.S. PATENT DOCUMENTS

| | | | | |
|---|---|---|---|---|
| 4,954,928 | A | * | 9/1990 | Jullien .................. H05K 5/026 361/679.31 |
| 5,010,426 | A | * | 4/1991 | Krenz .................. G11B 25/043 360/137 |
| 5,319,519 | A | * | 6/1994 | Sheppard ............. H05K 5/0295 312/319.1 |
| 5,721,669 | A | * | 2/1998 | Becker ................. G11B 33/124 361/679.31 |
| 5,793,614 | A | * | 8/1998 | Tollbom ............... H05K 7/1409 361/725 |
| 5,975,735 | A | | 11/1999 | Schmitt |
| 6,067,225 | A | * | 5/2000 | Reznikov ............. G11B 33/122 312/223.2 |
| 6,317,329 | B1 | * | 11/2001 | Dowdy ................ H05K 7/1418 312/223.3 |
| 6,317,334 | B1 | * | 11/2001 | Abruzzini ............ G11B 33/126 361/679.33 |
| 6,325,353 | B1 | * | 12/2001 | Jiang ....................... G06F 1/184 248/682 |
| 6,460,948 | B2 | * | 10/2002 | Roesner ................. G06F 1/184 312/223.1 |
| 6,549,424 | B1 | * | 4/2003 | Beseth ................. H05K 7/1409 361/726 |
| 6,698,937 | B2 | * | 3/2004 | Grimes ................ G02B 6/3825 385/53 |
| 6,967,283 | B2 | | 11/2005 | Rasmussen et al. |
| 7,014,051 | B2 | | 3/2006 | Rumney |
| 7,019,965 | B2 | * | 3/2006 | Bradley .................. G06F 1/184 361/679.38 |
| 7,072,177 | B2 | * | 7/2006 | Peng ....................... G06F 1/184 248/551 |
| 7,251,132 | B1 | * | 7/2007 | Paul ......................... G06F 1/187 248/618 |
| 7,291,032 | B1 | | 11/2007 | Carver |
| 7,364,452 | B2 | * | 4/2008 | Carver .................... H01R 43/26 439/310 |
| 7,417,866 | B1 | * | 8/2008 | Beseth ................. H05K 7/1409 361/728 |
| 7,515,428 | B2 | | 4/2009 | Tang |
| 7,558,058 | B2 | * | 7/2009 | Hidaka ................ G11B 33/126 361/679.38 |
| 7,654,844 | B1 | * | 2/2010 | Wormsbecher .. H01R 13/62938 361/727 |
| 7,719,835 | B1 | | 5/2010 | Schluter |
| 7,924,557 | B2 | * | 4/2011 | Li ........................... G06F 1/187 361/679.37 |
| 8,023,263 | B2 | * | 9/2011 | Crippen ................. G06F 1/187 312/223.1 |
| 8,083,197 | B2 | * | 12/2011 | Zhang ................. G11B 33/124 248/224.8 |
| 8,243,433 | B2 | * | 8/2012 | Yeh ........................ G06F 1/188 361/679.02 |
| 8,277,237 | B1 | | 10/2012 | Cherish |
| 8,369,080 | B2 | * | 2/2013 | Huang .................... G06F 1/187 361/679.37 |
| 8,456,832 | B1 | * | 6/2013 | Brigham, Jr. ........ G11B 33/124 361/679.35 |
| 8,514,562 | B2 | * | 8/2013 | Lin ......................... G06F 1/187 248/274.1 |
| 8,876,548 | B2 | | 11/2014 | Doorhy et al. |
| 9,374,926 | B1 | * | 6/2016 | Fontana ............... H05K 7/1492 |
| 9,451,721 | B1 | | 9/2016 | Shih et al. |
| 9,658,658 | B2 | * | 5/2017 | Yu .......................... G11B 33/00 |
| 9,781,858 | B2 | * | 10/2017 | Fricker ..................... H05K 7/18 |
| 10,130,000 | B2 | | 11/2018 | Johnson ............. H01R 13/6315 |
| 10,197,084 | B1 | * | 2/2019 | Ankney ............... H05K 7/1412 |
| 10,321,597 | B2 | | 6/2019 | Tseng |
| 2005/0024819 | A1 | | 2/2005 | Peng et al. |
| 2005/0111178 | A1 | | 5/2005 | Bradley et al. |
| 2005/0117309 | A1 | | 6/2005 | Rieken et al. |
| 2007/0217128 | A1 | | 9/2007 | Johnson, Jr. |
| 2008/0101040 | A1 | | 5/2008 | Tang |
| 2012/0170175 | A1 | | 7/2012 | Silberbauer et al. |
| 2013/0188309 | A1 | | 7/2013 | Ross |
| 2015/0234440 | A1 | | 8/2015 | Gardner et al. |
| 2015/0303419 | A1 | | 10/2015 | Hachiya et al. |
| 2015/0334868 | A1 | | 11/2015 | Fricker et al. |
| 2016/0183413 | A1 | | 6/2016 | Roesner et al. |
| 2016/0205802 | A1 | | 7/2016 | Köhler et al. |
| 2019/0082554 | A1 | | 3/2019 | Johnson et al. |

FOREIGN PATENT DOCUMENTS

| | | |
|---|---|---|
| CN | 103677201 A | 3/2014 |
| CN | 105557079 A | 5/2016 |
| JP | H113745 | 1/1999 |
| WO | 2016036373 | 3/2016 |

OTHER PUBLICATIONS

CNIPA, Office Action from related CN Appl. No. 201710941402.5, dated May 8, 2020, 14 pages (with translation).

* cited by examiner

POWER CONNECTOR FOR ELECTRONIC EQUIPMENT SUPPORTED BY A RACK ASSEMBLY

CROSS-REFERENCE TO RELATED APPLICATIONS

This application is a divisional application of U.S. patent application Ser. No. 15/290,488, now U.S. Pat. No. 10,130,000, which was filed Oct. 11, 2016.

BACKGROUND

The field of the disclosure relates generally to power connectors, and more specifically, to positionable power connectors for coupling a power source to electronic equipment supported by a rack assembly.

Large data processing centers (e.g., server farms) are used to perform data transactions such as, without limitation, storing, retrieving, and/or processing data, for companies and individuals all over the world. At least some known data processing centers use electronic equipment to perform data transactions on behalf of third parties in return for a fee. As the fee is typically based on the number of transactions performed, known data processing centers use large quantities of electronic equipment to perform large quantities of data transactions.

At least some known data processing centers include rack assemblies and shelves that support the electronic equipment. During assembly, the shelves are inserted into the rack assemblies and positioned such that front and rear faces of the electronic equipment are available for coupling to components. In at least some known data processing centers, a power supply is located along the rear face of the shelves to provide power to the electronic equipment. However, the position of the power supply limits the space available on the rear face of the electronic equipment. Moreover, the depth of the shelves and the position of the electronic equipment are limited by the location of the power supply.

BRIEF DESCRIPTION

In one aspect, an electronic system is provided. The electronic system includes a rack assembly including a first rail and a second rail. The first rail and the second rail define a first width therebetween. The electronic system also includes a chassis that supports electronic components and is insertable between the first rail and the second rail. The chassis includes a first side and a second side. The first side and the second side define a second width therebetween. The second width is less than the first width. The electronic system further includes a power connector coupled to the chassis and movable between a first position and a second position. The power connector is arranged to extend from the first side when the power connector is in the first position. The power connector and the second side define a third width when the power connector is in the first position. The power connector and the second side define a fourth width when the power connector is in the second position. The third width is greater than the first width and the fourth width is less than the first width.

In another aspect, a power connector for an electronic system is provided. The power connector includes an outer casing couplable to a chassis. The outer casing is positioned substantially between sides of the chassis. The power connector also includes a body that is movably coupled to the outer casing. The body is movable between a first position and a second position. The body is arranged to extend beyond the outer casing in the first position and the body is arranged to be positioned substantially within the outer casing in the second position.

In yet another aspect, a method of assembling an electronic system is provided. The method includes coupling a first rail to a second rail to form a rack assembly. The first rail and the second rail are spaced apart in a lateral direction. The first rail and the second rail define a first width therebetween. The method also includes coupling a chassis to the first rail and the second rail. The chassis includes a first side and a second side spaced apart in the lateral direction. The first side and the second side define a second width therebetween. The second width is less than the first width. The method further includes coupling a power connector to the chassis. The power connector is movable between a first position and a second position. The power connector and the second side define a third width when the power connector is in the first position and the power connector and the second side define a fourth width when the power connector is in the second position. The third width is greater than the first width and the fourth width is less than the first width.

In yet another aspect, an electronic system is provided. The electronic system includes a rack assembly including a first rail and a second rail. The electronic system also includes a chassis arranged to support electronic components and insertable between the first rail and the second rail. The electronic system further includes a latch assembly coupled to at least one of the rack assembly and the chassis. The latch assembly includes a latch movable between an unlocked position and a locked position. The latch assembly also includes a latch plate defining a cam that engages the latch. The latch is arranged to move through the cam when the latch is moved between the unlocked position and the locked position. The shelf is moveable between a first position and a second position when the latch is moved through the cam.

DETAILED DESCRIPTION

The embodiments described herein provide a power connector that is selectively positionable. The power connector couples electronic equipment supported on a chassis to a power source positioned along a side of the chassis. The power connector is movable between a first position and a second position. When the power connector is in the first position, the power connector is aligned with the power source. When the power connector is in the second position, the power connector facilitates insertion of the chassis between rails of a rack assembly. A busbar of the power source is positioned adjacent one of the rails such that chassis having different power architecture move past the busbar without interference and interaction between the chassis and the busbar.

Figure 1:
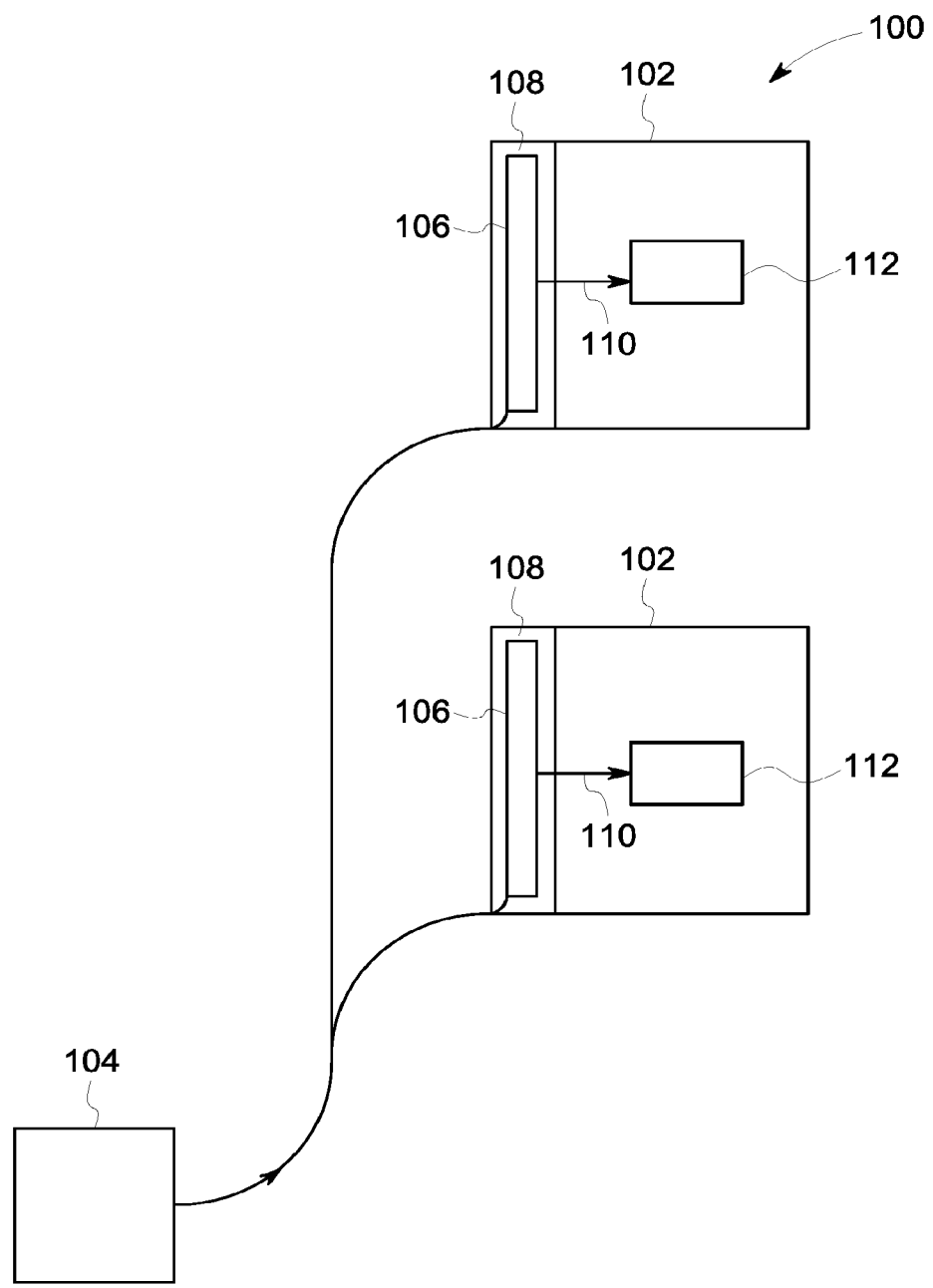
FIG. 1 is a block diagram of an exemplary data processing center for use in performing data transactions.

FIG. 1 is a block diagram of an exemplary data processing center 100 for use in performing data transactions. In the exemplary embodiment, data processing center 100 includes a plurality of rack assemblies 102. Rack assemblies 102 are configured to electrically couple to an electrical power source 104 and to receive electric current from electrical power source 104. Electrical power source 104 is, for example, the commercial power grid, two independent grids, high voltage DC, or in some embodiments, low voltage DC. In alternative embodiments, rack assemblies 102 receive power from any power source that enables rack assemblies 102 to operate as described herein. In the exemplary embodiment, each rack assembly 102 includes power equipment 106 spaced throughout a side power sub-compartment 108. Power equipment 106 includes a power supply or busbar 110 configured to provide electric current to electronic equipment 112 that is supported by rack assemblies 102. Power supply 110 extends the entire height of rack assembly 102 and is located within rack assembly 102. In alternative embodiments, rack assembly 102 includes any power equipment 106 that enables rack assembly 102 to operate as described herein. For example, in some embodiments, power equipment 106 is contained within equipment space of rack assembly 102.

Figure 2:
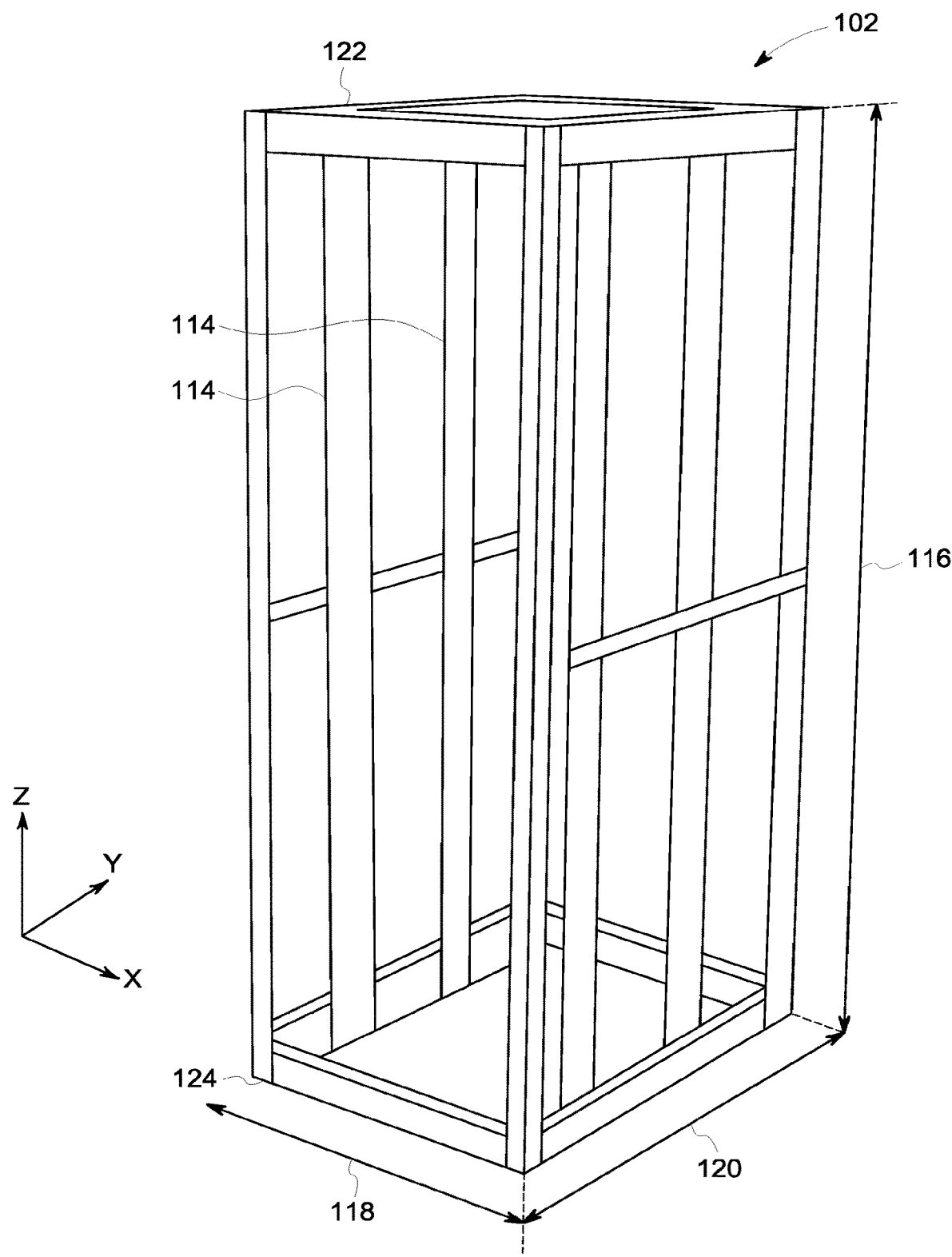
FIG. 2 is a perspective view of an exemplary rack assembly of the data processing center shown in FIG. 1.

FIG. 2 is a perspective view of a single rack assembly 102 of data processing center 100 (shown in FIG. 1). FIG. 2 includes an X-axis, a Y-axis, and a Z-axis for reference throughout this description. Rack assembly 102 includes a plurality of rails 114 extending in the X-direction, the Y-direction, and the Z-direction such that rack assembly 102 has a height 116, a width 118, and a depth 120. As shown in FIG. 2, rack assembly 102 further includes a top end 122 and a bottom end 124. In the exemplary embodiment, rails 114 extend vertically between top end 122 and bottom end 124. Moreover, rails 114 are spaced apart laterally in the X-direction and define shelf spaces therebetween. A width 126 (shown in FIG. 3) of the shelf spaces is defined between inner surfaces of rails 114. In alternative embodiments, rack assembly 102 has any configuration that enables rack assembly 102 to operate as described herein.

Figure 3:
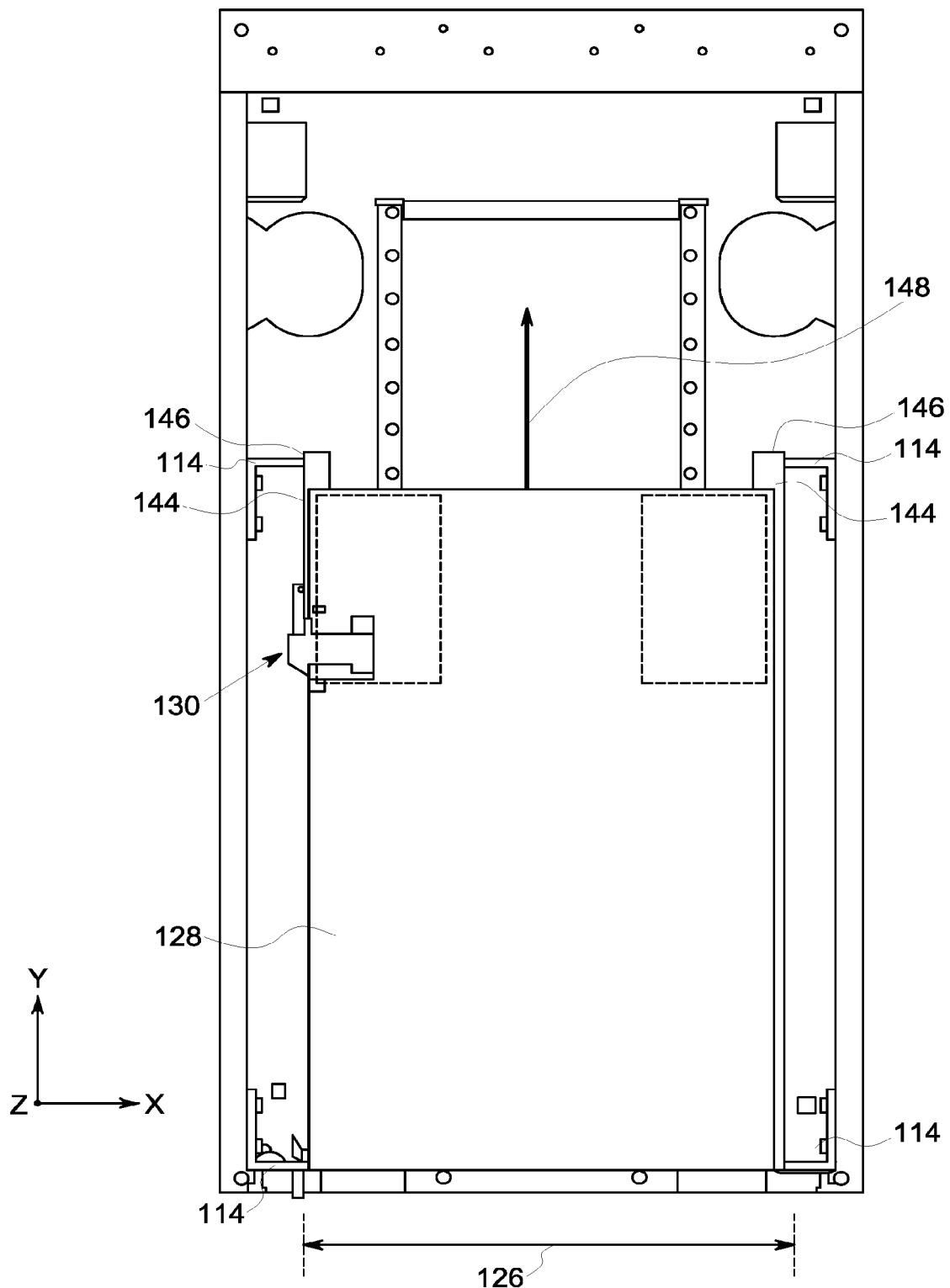
FIG. 3 is a top view of the rack assembly shown in FIG. 2 including a shelf for supporting electronic equipment.
Figure 4:
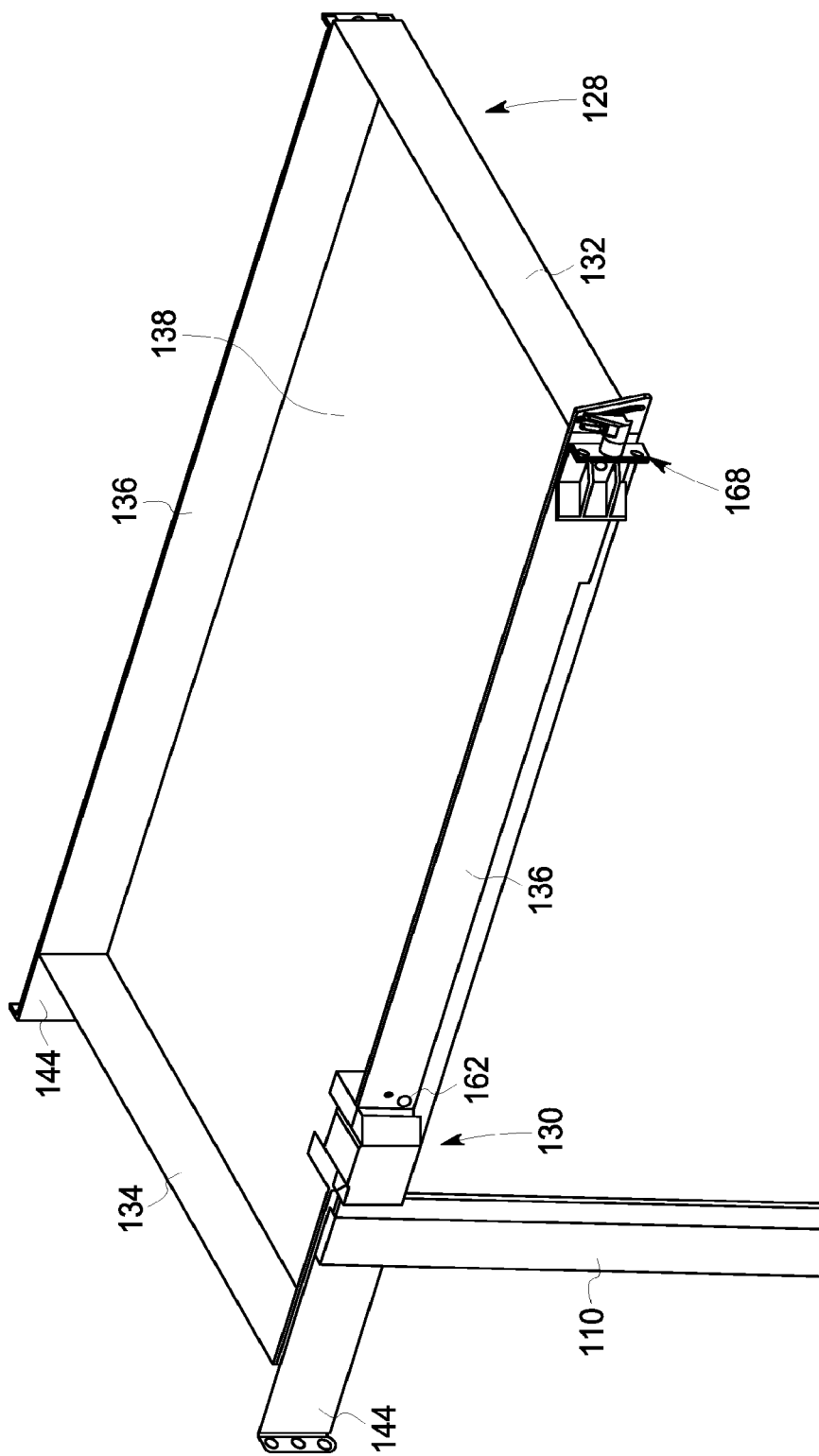
FIG. 4 is a perspective view of the shelf shown in FIG. 3 with a power connector coupled to a power supply busbar.

FIG. 3 is a top view of rack assembly 102 including a shelf or sled or chassis 128 for supporting electronic equipment 112 (shown in FIG. 1). FIG. 3 includes an X-axis, a Y-axis, and a Z-axis for reference throughout this description. FIG. 4 is a perspective view of shelf 128 with a power connector 130 coupled to power supply 110. In some embodiments, shelf 128 supports any electronic equipment 112 (shown in FIG. 1) that enables data processing center 100 (shown in FIG. 1) to operate as described herein. In the exemplary embodiment, power connector 130 couples electronic equipment 112 (shown in FIG. 1) to power supply 110. Electric current is provided to electronic equipment 112 (shown in FIG. 1) by power supply 110 through power connector 130.

In the exemplary embodiment, power supply 110 is coupled to rails 114 and fixed in position. Moreover, power supply 110 is registered with rails 114 such that power supply 110 is out of the path of objects inserted between rails 114. In particular, power supply 110 is positioned between a front rail 114 and a rear rail 114 and positioned outside width 126. Accordingly, power supply 110 does not interfere with different types of power architecture positioned anywhere on shelf 128. As a result, power supply 110 facilitates use of shelves 128 having different power architectures and/or different depths. In alternative embodiments, power supply 110 is positioned in any manner that enables rack assembly 102 to operate as described herein.

Figure 5:
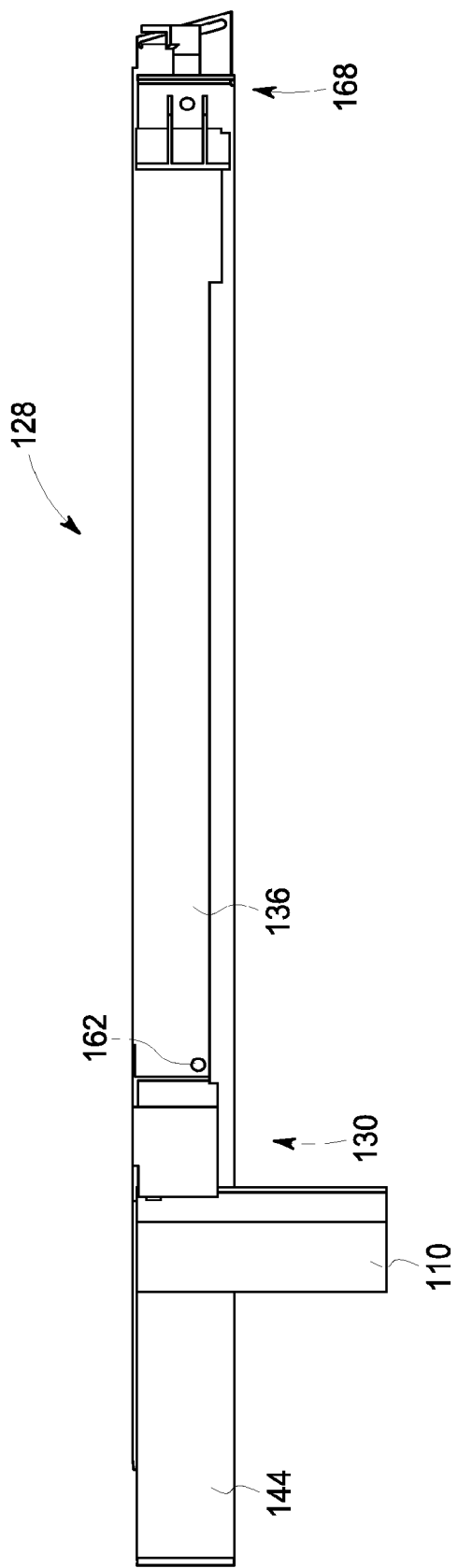
FIG. 5 is a side view of the shelf shown in FIG. 3.
Figure 6:
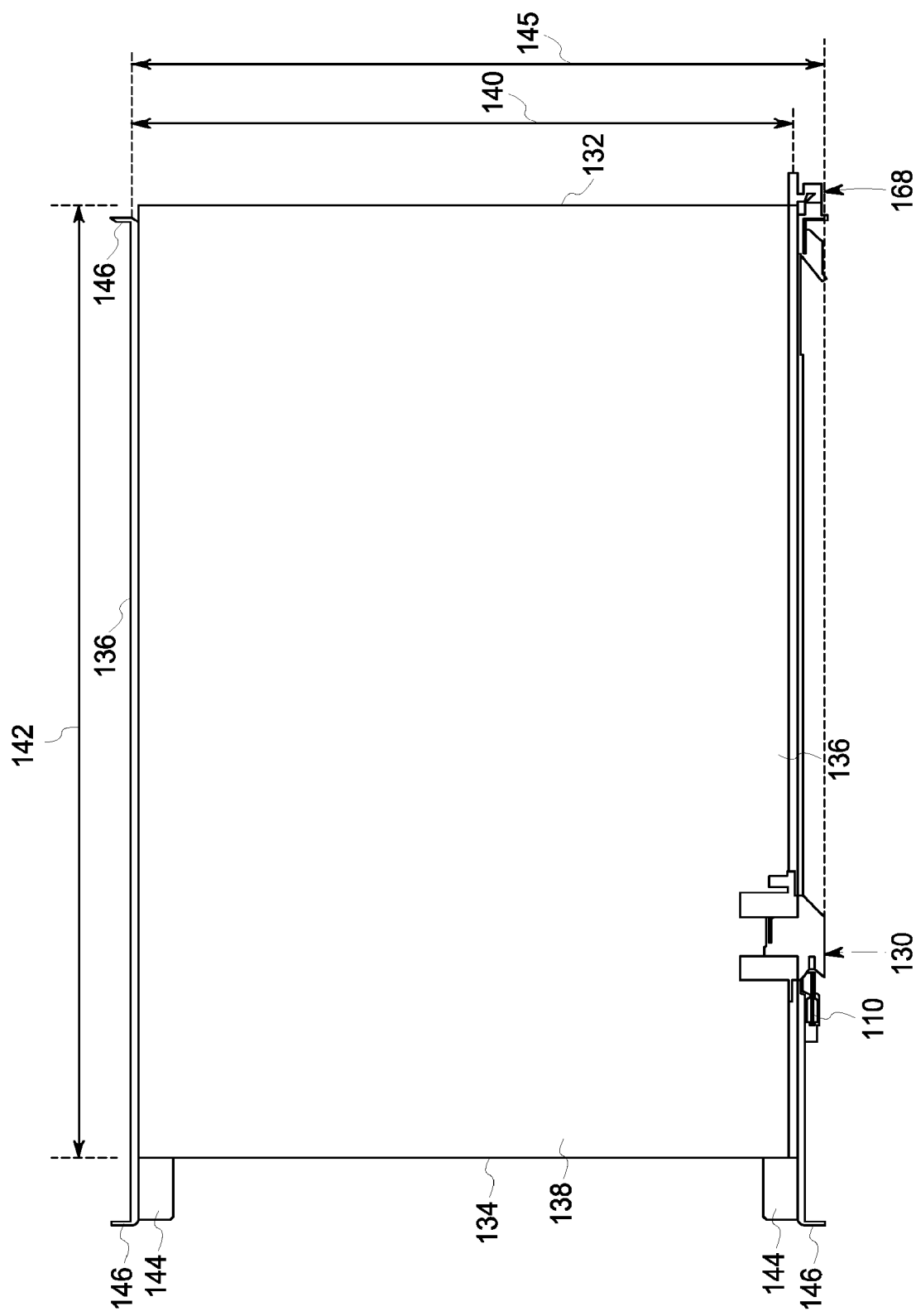
FIG. 6 is a top view of the shelf shown in FIG. 3.

FIG. 5 is a side view of shelf 128. FIG. 6 is a top view of shelf 128. In the exemplary embodiment, shelf 128 includes a front face 132, a rear face 134, sides 136, and a base 138. Each of front face 132, rear face 134, and sides 136 extend from a respective outer edge of base 138 such that together front face 132, rear face 134, and sides 136 circumscribe base 138. A width 140 of shelf 128 is defined between sides 136. A length 142 of shelf 128 is defined between front face 132 and rear face 134. In the exemplary embodiment, sides 136, front face 132, and rear face 134 are orthogonal to each other and length 142 is greater than width 140. Accordingly, shelf 128 has a rectangular shape. In alternative embodiments, shelf 128 has any shape that enables shelf 128 to operate as described herein.

In reference to FIG. 3, in the exemplary embodiment, shelf 128 is movably supported by guides 144 that are coupled to rails 114. In particular, guides 144 extend in the Y-direction and are coupled to rails 114 of rack assembly 102 by ears or brackets 146. Guides 144 are longer than shelf 128 and extend along depth 120 of rack assembly 102. In operation, shelf 128 moves along guides 144 through depth 120 of rack 102. In some embodiments, shelves 128 and electronic equipment 112 (shown in FIG. 1) extend different distances of depth 120 because the position of power connector 130 and power supply 110 adjacent side 136 enables power supply 110 to couple to electronic equipment 112 positioned at different depths. Accordingly, shelves 128 and electronic equipment 112 (shown in FIG. 1) are not required to extend the full depth 120 of rack assembly 102 to couple to a power supply located at the rear of rack assembly 102. In alternative embodiments, shelf 128 is supported in any manner that enables shelf 128 to operate as described herein.

Also, in the exemplary embodiment, shelf 128 is insertable into the shelf spaces defined by rack assembly 102. For insertion, shelf 128 is positioned on guides 144 and moved in an insertion direction 148 parallel to the Y-axis. Shelf 128 is positioned on guides 144 such that sides 136 are parallel to insertion direction 148. Front face 132 and rear face 134 are perpendicular to insertion direction 148. Shelf 128 moves along guides 144 into the shelf space between rails 114. Shelf 128 fits between rails 114 because width 140 of shelf 128 is less than width 118. As shelf 128 is moved along guides 144, rails 114 pass or sweep sides 136. When power connector 130 is in a first position (shown in FIG. 8), power connector 130 extends in the sweep of rails 114. When power connector 130 is in a second position (shown in FIG. 9), power connector 130 does not extend in the sweep of rails 114. In operation, power connector 130 is moved to the second position before shelf 128 is inserted between rails 114. Once power connector 130 is beyond rails 114, power connector 130 is moved into the first position and is coupled to power supply 110.

In reference to FIG. 6, power connector 130 and side 136 define a maximum width 145 when power connector 130 is in the first position. Maximum width 145 is greater than width 118 and width 140. Accordingly, maximum width 145 inhibits insertion of shelf 128 into the shelf space when power connector 130 is in the first position and shelf 128 is in a level position. In contrast, when power connector 130 is in the second position, power connector 130 is positioned within sides 136 and does not extend substantially beyond sides 136 of shelf 128. Accordingly, in the second position, power connector 130 facilitates shelf 128 fitting between rails 114. In alternative embodiments, power connector 130 and shelf 128 define any width that enables shelf 128 to function as described herein.

Figure 7:
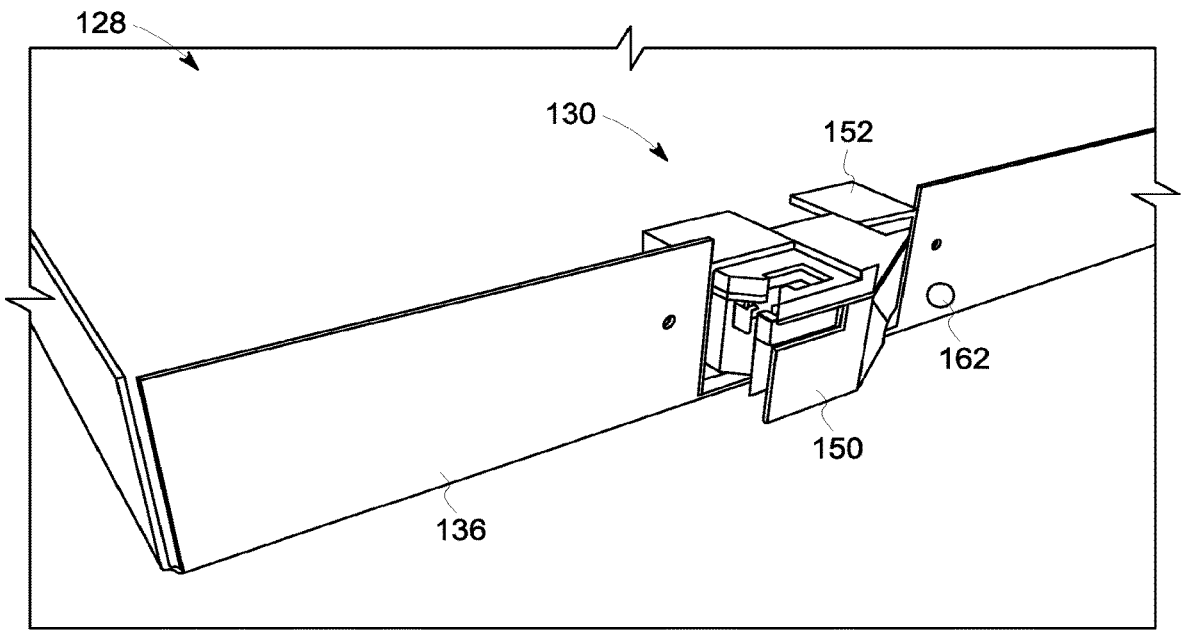
FIG. 7 is a perspective view of a portion of the shelf shown in FIG. 3 including the power connector shown in FIG. 4.
Figure 8:
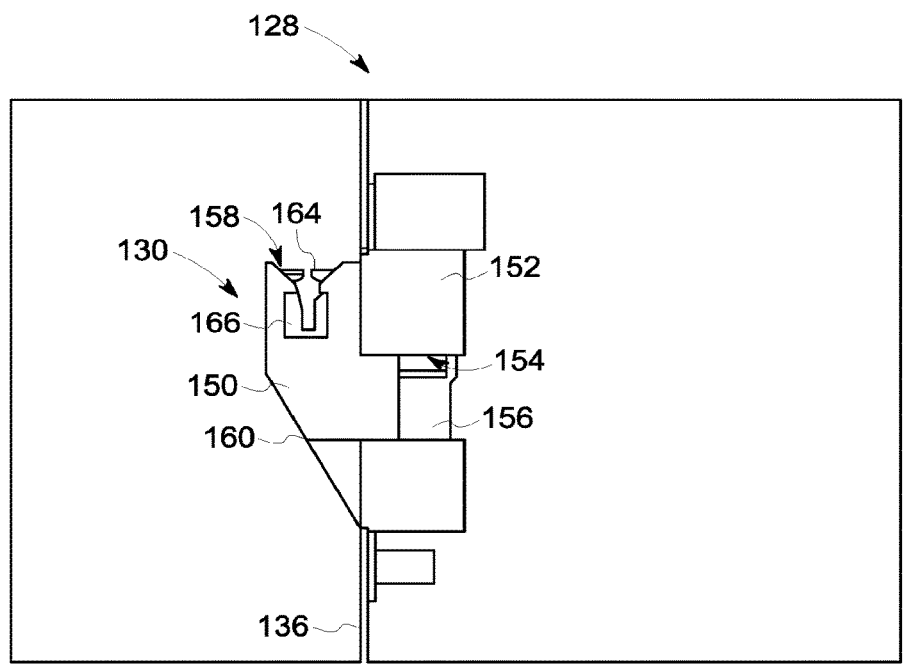
FIG. 8 is a top view of the power connector shown in FIG. 7 in a first position.
Figure 9:
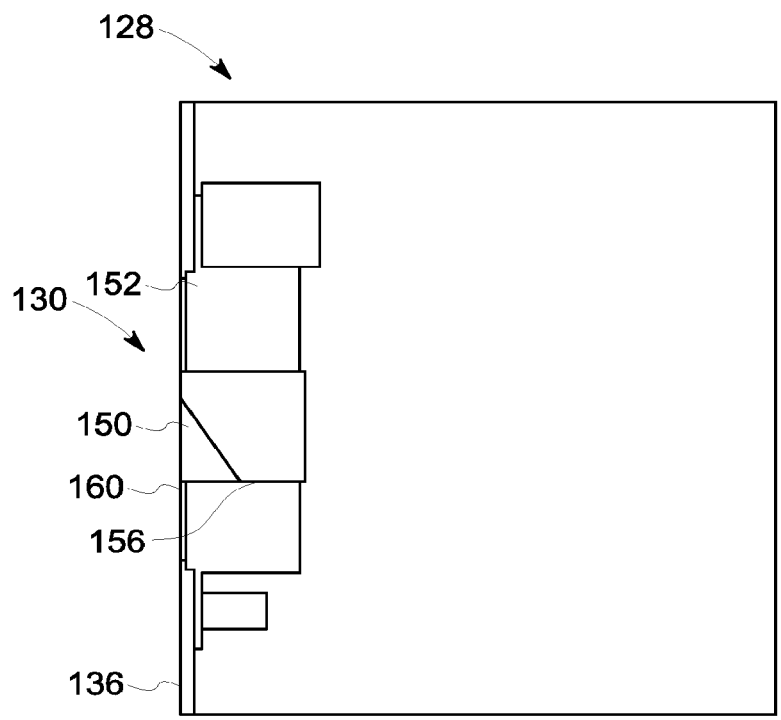
FIG. 9 is a top view of the power connector shown in FIG. 7 in a second position.

FIG. 7 is a perspective view of a portion of shelf 128 including power connector 130. FIG. 8 is a top view of power connector 130 in the first position. FIG. 9 is a top view of power connector 130 in the second position. Power connector 130 includes a body 150, an outer casing 152, and a biasing member 154. Body 150 is movably coupled to outer casing 152. In particular, body 150 moves linearly within outer casing 152. Outer casing defines grooves 156 that guide the movement of body 150. Outer casing 152 and body 150 are configured such that body 150 moves in a direction substantially perpendicular to insertion direction 148 of shelf 128. Body 150 extends beyond outer casing 152 when power connector 130 is in the first position (shown in FIG. 8) and body 150 is within outer casing 152 when power connector 130 is in the second position (shown in FIG. 9). In alternative embodiments, shelf 128 includes any power connector 130 that enables shelf 128 to operate as described herein. For example, in some embodiments, body 150 is fixed and outer casing 152 moves relative to body 150. In further embodiments, substantially all of power connector 130 moves relative to shelf 128. In some embodiments, at least a portion of power connector 130 pivots.

Also, in the exemplary embodiment, body 150 includes a coupling mechanism 158 and a ramp 160 opposite coupling mechanism 158. Ramp 160 has an inclined surface for contacting rail 114. Power connector 130 moves between the first position and the second position when ramp 160 is contacted with a sufficient force, i.e., a force greater than the biasing force of biasing member 154. For example, rail 114 (shown in FIG. 2) contacts ramp 160 when shelf 128 is removed from rack assembly 102 (shown in FIG. 2) and induces power connector 130 to move to the second position to facilitate the removal of shelf 128. In alternative embodiments, power connector 130 includes any ramp 160 that enables power connector 130 to function as described herein. For example, in some embodiments, ramp 160 is positioned on a rear face of power connector 130 such that ramp 160 contacts rail 114 (shown in FIG. 2) as shelf 128 is inserted into rack assembly 102 (shown in FIG. 2).

In addition, in the exemplary embodiment, biasing member 154 extends between body 150 and outer casing 152 and biases body 150 towards the exterior of outer casing 152. In particular, biasing member 154 biases body 150 towards a fully extended position. In alternative embodiments, power connector 130 includes any biasing member 154 that enables power connector 130 to operate as described herein. For example, in some embodiments, power connector 130 includes a biasing member 154 that biases body 150 towards the interior of outer casing 152.

In reference to FIGS. 4, 5, and 7, an actuator 162 is coupled to body 150 and configured to induce movement of power connector 130 between the first position and the second position. In the exemplary embodiment, actuator 162 includes a button extending from side 136 of shelf 128. When actuator 162 is depressed, actuator 162 allows body 150 to move between the first position and the second position. In particular, in the exemplary embodiment, actuator 162 selectively allows biasing member 154 to bias body 150 towards the second position. In some embodiments, when actuator 162 is depressed, body 150 is inhibited from moving between the first position and the second position and is maintained in intermediate positions by objects such as rails 114 and/or ears 146. In alternative embodiments, shelf 128 includes any actuator 162 that enables shelf 128 to operate as described herein. For example, in some embodiments, actuator 162 is coupled to front face 132 of shelf 128. In further embodiments, actuator 162 includes, without limitation, any of the following: a lever, a switch, a button, and a trigger.

Figure 10:
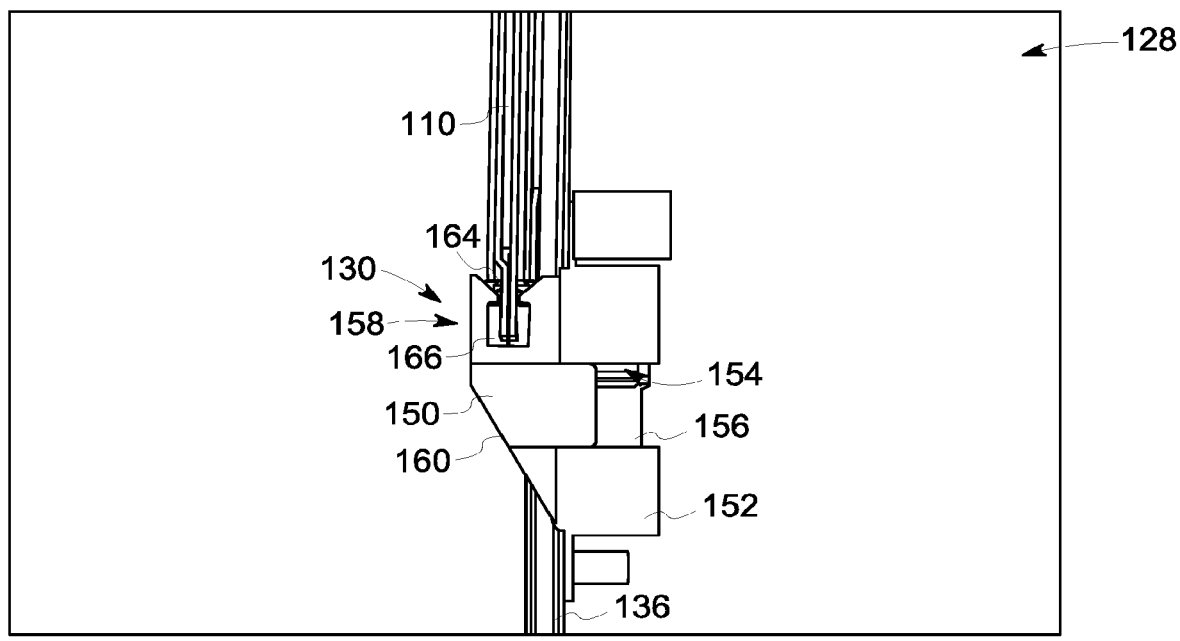
FIG. 10 is a top view of the power connector shown in FIG. 7 coupled to the power supply busbar shown in FIG. 4.

FIG. 10 is a top view of power connector 130 coupled to power supply 110. As shown in FIG. 10, power connector 130 is positioned in the first position to enable power connector 130 to couple to power supply 110. Coupling mechanism 158 couples power connector 130 to power supply 110 to enable current to flow from power supply 110 through power connector 130 towards electronic equipment 112 (shown in FIG. 1) supported on shelf 128. Coupling mechanism 158 includes a first contact 164 and a second contact 166. First contact 164 contacts power supply 110 and initiates a flow of current through a high impedance path, i.e., a precharge. Second contact 166 contacts power supply 110 after first contact 164 and facilitates the full flow of current through a lower impedance path. Accordingly, first contact 164, second contact 166, and power supply 110 form a long pin and short pin connection. First contact 164 and second contact 166 facilitate connection of power connector 130 to power supply 110 while power supply 110 provides power to other electronic equipment 112, i.e., a hot swap, without utilizing active switching electronics. For example, the precharge reduces the risk of disabling other electronic equipment 112 when coupling power connector 130 to power supply 110. In some embodiments, rack assembly 102 is stopped and/or delayed during insertion to allow for the precharge. In alternative embodiments, power connector 130 includes any coupling mechanism 158 that enables data processing center 100 to operate as described herein.

Also, in the exemplary embodiment, at least a portion of power connector 130 has freedom of movement relative to power supply 110 to allow coupling mechanism 158 to accommodate misalignment of power connector 130 and power supply 110. In the exemplary embodiment, body 150 is allowed to rotate relative to outer casing 152 to facilitate coupling mechanism 158 coupling to power supply 110.

In reference to FIGS. 1 and 2, shelf 128 and rack assembly 102 are grounded. In particular, rail 146 is electrically connected to shelf 128 and provides a flow path for current to flow from electronic equipment 112 towards ground. In alternative embodiments, data processing center 100 is grounded in any manner that enables data processing center 100 to operate as described herein.

Figure 11:
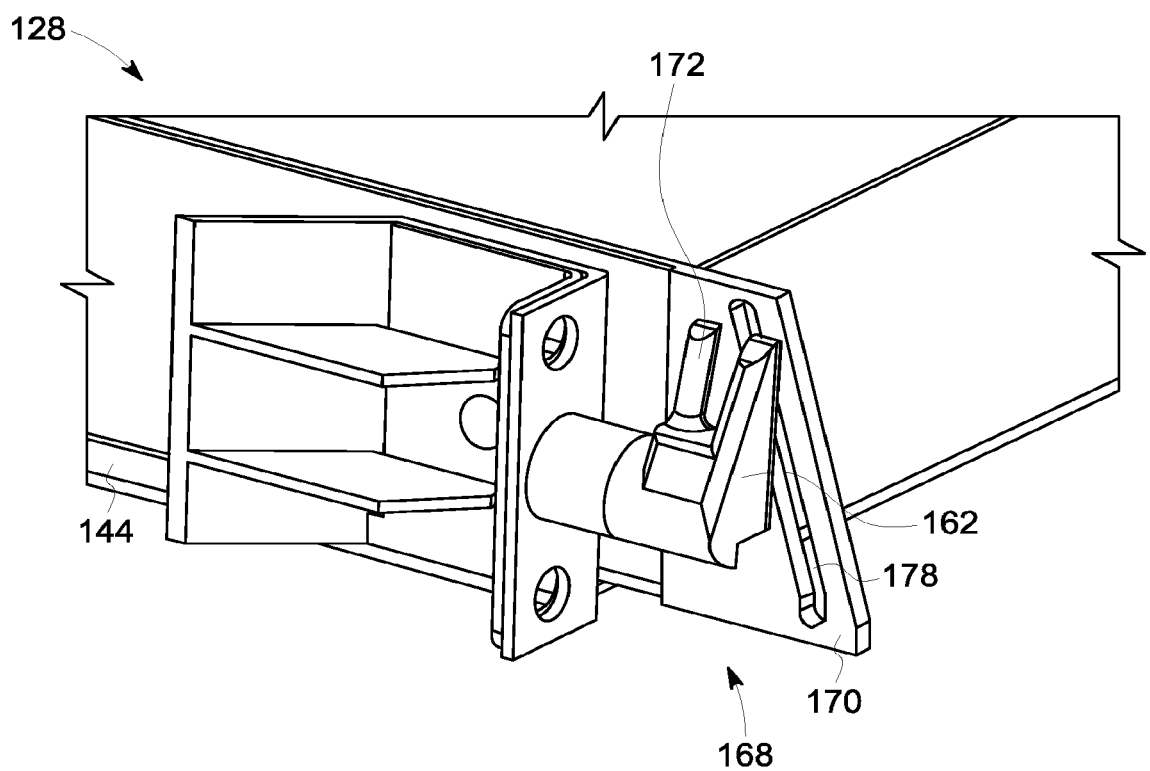
FIG. 11 is a perspective view of a portion of the shelf shown in FIG. 3 including a latch assembly.
Figure 12:
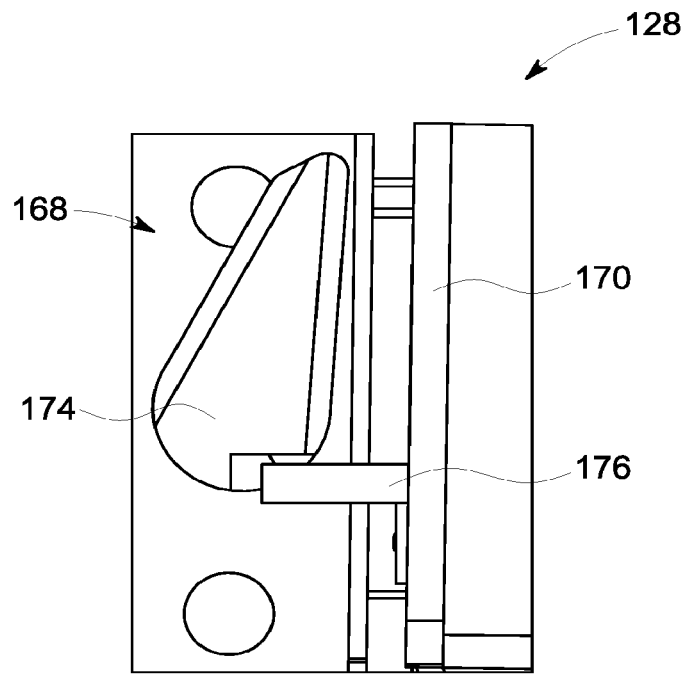
FIG. 12 is a front view of the latch assembly shown in FIG. 11.

FIG. 11 is a perspective view of a portion of shelf 128 including a latch assembly 168. FIG. 12 is a side view of latch assembly 168. Latch assembly 168 includes a latch plate 170, a latch 172, an actuator 174, and a stop 176. Latch plate 170 is coupled to shelf 128 and latch 172 is coupled to guide 144. Latch 172 is positionable between a first position and a second position to selectively secure shelf 128 in position. Latch plate 170 defines a cam opening 178 configured to receive latch 172. In the first position, latch 172 is spaced from latch plate 170. In the second position, latch 172 extends at least partially into cam opening 178 and inhibits movement of shelf 128. As latch 172 moves between the first position and the second position, latch 172 moves through cam opening 178 and induces movement of shelf 128. In particular, latch 172 induces shelf 128 to move along insertion direction 148 (shown in FIG. 3) as latch 172 moves along a nonlinear edge of cam opening 178. Shelf 128 is moved between a first position where power supply 110 (shown in FIG. 10) contacts first contact 164 (shown in FIG. 10) and a second position where power supply 110 contacts second contact 166 (shown in FIG. 10) as latch 172 moves along cam opening 178. In some embodiments, latch assembly 168 induces shelf 128 to move a distance in a range of about 1 millimeter (0.04 inches) to about 25 millimeters (1 inch). In the exemplary embodiment, latch assembly 168 induces shelf 128 to move a distance of approximately 10 millimeters (0.4 inches). In alternative embodiments, shelf 128 moves any distance that enables shelf 128 to function as described herein. In some embodiments, latch assembly 168 does not induce movement of shelf 128.

In the exemplary embodiment, latch 172 is spaced from shelf 128 in the first position and the second position. Accordingly, when latch 172 is in the first position and the second position, latch assembly 168 does not obstruct front face 132 and does not limit the area of front face 132 that is available for coupling components to electronic equipment 112 (shown in FIG. 1). Latch 172 is free to sweep past front face 132 when moving between the first position and the second position because components are decoupled from electronic equipment 112 (shown in FIG. 1) prior to insertion or removal of shelf 128. After shelf 128 has been inserted into the shelf space and secured in place by latch assembly 168, the entire front face 132 is available to couple components to electronic equipment 112 (shown in FIG. 1). In alternative embodiments, rack assembly 102 includes any latch assembly 168 that enables rack assembly 102 to operate as described herein.

In the exemplary embodiment, latch 172 includes an elongate rod that is rotatably coupled to guide 144. In some embodiments, latch 172 has a thickness in a range from about 1 millimeter (0.04 inches) to about 5 millimeters (0.2 inches). In the exemplary embodiment, latch 172 has a thickness of approximately 3.2 millimeters (0.125 inches). In alternative embodiments, latch assembly 168 includes any latch 172 that enables latch assembly 168 to operate as described herein. For example, in some embodiments, latch 172 includes a helical thread that engages cam opening 178.

Also, in the exemplary embodiment, actuator 174 includes an elongate lever that rotates about an axis. Actuator 174 is integrally formed with latch 172. Accordingly, actuator 174 and latch 172 rotate together. In some embodiments, actuator 174 includes a handle. In alternative embodiments, latch assembly 168 includes any actuator 174 that enables latch assembly 168 to operate as described herein.

In addition, in the exemplary embodiment, latch plate 170 is substantially flat and has a triangular shape. Cam opening 178 is an elongate slot extending substantially parallel to an angled side of latch plate 170. Cam opening 178 is sized and shaped to receive latch 172 when latch 172 is positioned in the second position. Moreover, cam opening 178 is sized and shaped such that latch 172 moves through cam opening 178 as latch 172 moves between the first position and the second position. In addition, cam opening 178 includes a detent to receive latch 172 in the second position and inhibit latch 172 moving out of the second position. In alternative embodiments, latch assembly 168 includes any latch plate 170 that enables latch assembly 168 to function as described herein. For example, in some embodiments, latch plate 170 includes a positive stop that retains latch 172 in the second position. In further embodiments, cam opening 178 is at least partially curved.

In reference to FIG. 12, latch assembly 168 further includes stop 176. Stop 176 extends from latch plate 170 and contacts actuator 174 when latch 172 is in the first position. Accordingly, stop 176 inhibits movement of shelf 128 along insertion direction 148 (shown in FIG. 3). Latch assembly 168, power connector 130, and power supply 110 are positioned and configured such that first contact 164 contacts power supply 110 when stop 176 inhibits movement of shelf 128. As actuator 174 is rotated, a stepped portion of actuator 174 moves beyond stop 176. Accordingly, stop 176 and shelf 128 are allowed to advance along insertion direction 148 when actuator 174 is rotated. When actuator 174 and stop 176 disengage, shelf 128 is allowed to advance such that second contact 166 contacts power supply 110. In alternative embodiments, latch assembly 168 includes any stop 176 that enables latch assembly 168 to operate as described herein. In some embodiments, stop 176 is omitted.

Figure 13:
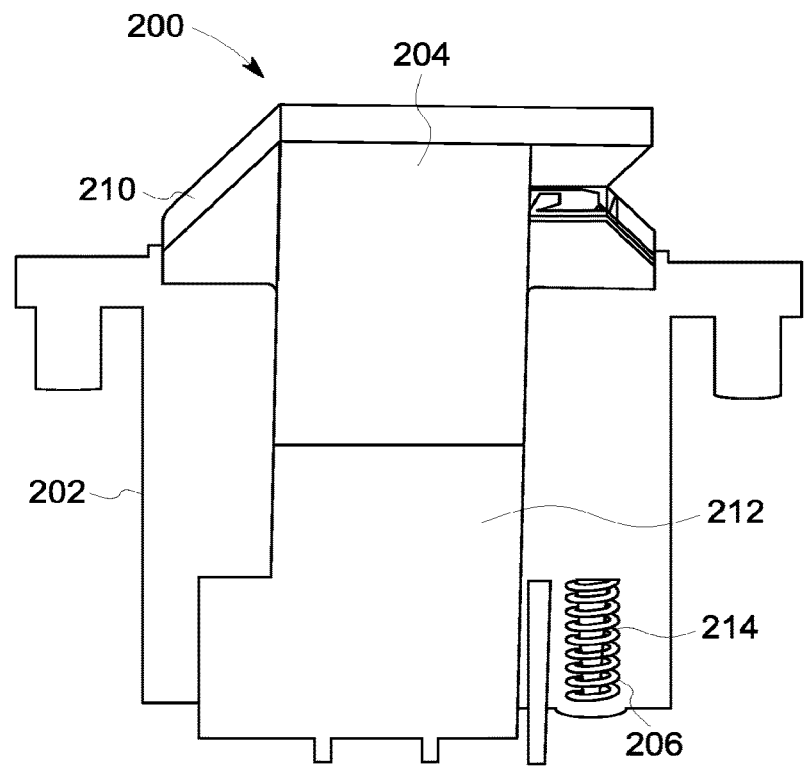
FIG. 13 is a top view of an exemplary power connector.
Figure 14:
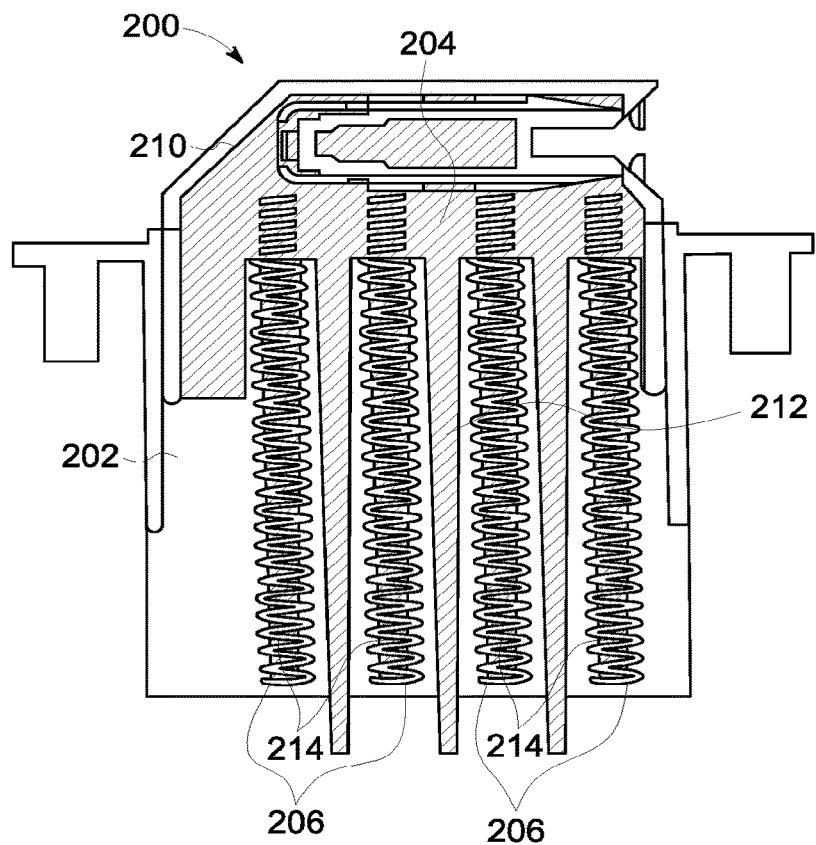
FIG. 14 is a section view of the power connector shown in FIG. 11.

FIG. 13 is a side view of a power connector 200. FIG. 14 is a section view of power connector 200. Power connector 200 includes an outer casing 202, a body 204, and biasing members 206. Outer casing 202 couples to shelf 128 (shown in FIG. 3) such that outer casing 202 is fixed relative to shelf 128. In particular, outer casing 202 is coupled to shelf 128 (shown in FIG. 3) such that outer casing 202 is positioned substantially between sides 136 (shown in FIG. 3) of shelf 128. Body 204 is movable relative to outer casing 202. In particular, body 204 moves linearly between a first position and a second position. Biasing members 206 bias body 204 towards the first position. In alternative embodiments, power connector 200 has any configuration that enables power connector 200 to operate as described herein.

In the exemplary embodiment, body 204 includes a coupling mechanism 208, a ramp 210, a slide 212, and prongs 214. Coupling mechanism 208 extends from an end of body 204 and is configured to couple to power supply 110 (shown in FIG. 3). Ramp 210 is opposite coupling mechanism 208. Body 204 is configured to move between the first position and the second position when ramp 210 is contacted. Slide 212 extends into grooves in outer casing 202 to guide the movement of body 204. In alternative embodiments, power connector 200 includes any body 204 that enables power connector 200 to operate as described herein.

Also, in the exemplary embodiment, biasing members 206 extend between and are coupled to body 204 and outer casing 202. In particular, biasing members 206 are positioned about prongs 214 of body 204 and contact outer casing 202 and body 204. In the exemplary embodiment, biasing members 206 are helical compression springs. Moreover, power connector 200 includes four biasing members 206. In alternative embodiments, power connector 200 includes any biasing member 206 that enables power connector 200 to operate as described herein. For example, in some embodiments, power connector 200 includes, without limitation, any of the following biasing members 206: a leaf spring, a compression spring, a pneumatic member, a torsion spring, a tension spring, a pinned hinge, and/or any other biasing member that enables power connector 200 to operate as described herein. In further embodiments, power connector includes a single biasing member. In some embodiments, biasing member 206 is integrally formed with other outer casing 202 and/or body 204.

In some embodiments, wires or lines (not shown) are configured to bias power connector 200 between the first position and the second position. The lines are used to supply power and/or transmit signals to and/or from electronic equipment 112 (shown in FIG. 1). In some embodiments, the lines form a wire set. The lines extend through body 204 and are coupled to outer casing 202 to reduce strain. The lines dress off body 204 and include a service loop positioned between body 204 and outer casing 202. Accordingly, the lines bias body 204 towards the first position. Due to the lines acting as a biasing member 206, the number of parts required to assemble power connector 200 is reduced.

In reference to FIGS. 2 and 3, a method of assembling an electronic system includes coupling first rail 114 to second rail 114 to form rack assembly 102. First rail 114 and second rail 114 extend in a vertical direction and are spaced apart in a lateral direction. In some embodiments, the method includes coupling power supply 110 to rack assembly 102. The method also includes coupling shelf 128 to rack assembly 102 between first rail 114 and second rail 114. In some embodiments, the method includes coupling guide 144 to rail 114 and shelf 128. The method further includes coupling power connector 130 to shelf 128. Power connector 130 is movable between a first position and a second position to facilitate positioning shelf 128 between rails 114. In some embodiments, outer casing 152 is coupled to shelf 128 and body 150 is coupled to outer casing 152 such that body 150 moves relative to outer casing 152. In further embodiments, biasing member 154 is coupled to body 150 to bias body 150 towards the first position.

The embodiments described above provide a power connector that is selectively positionable. The power connector couples electronic equipment supported on a shelf to a power source positioned along a side of the shelf. The power connector is movable between a first position and a second position. When the power connector is in the first position, the power connector is aligned with the power source. When the power connector is in the second position, the power connector facilitates insertion of the shelf between rails of a rack assembly. A busbar of the power source is positioned adjacent one of the rails such that chassis having different power architecture move past the busbar without interference and interaction between the chassis and the busbar.

An exemplary technical effect of the methods, systems, and apparatus described herein includes at least one of: (a) reducing cost and time required to assemble electronic systems; (b) providing power connectors that couple power supplies at a standard location to equipment on shelving units having different depths; (d) increasing computing capacity of revenue producing units; (e) increasing the available space for coupling to revenue producing units; (f) providing a power connector that couples to a power supply located along a side of a rack assembly; (g) facilitating the use of shelving units having different power equipment in the same rack assembly; and (h) providing rack assemblies that interchangeably accept shelfing units having different power configurations.

Exemplary embodiments of electronic systems and methods of assembling electronic systems are described above in detail. The electronic systems and methods are not limited to the specific embodiments described herein but, rather, components of the electronic systems and/or operations of the methods may be utilized independently and separately from other components and/or operations described herein. Further, the described components and/or operations may also be defined in, or used in combination with, other systems, methods, and/or devices, and are not limited to practice with only the electronic systems and systems described herein.

The order of execution or performance of the operations in the embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power connector for an electronic system including a shelf for mounting in a rack assembly, the power connector comprising:
   an outer casing selectively couplable to the shelf, and
   a body mounted to the outer casing for movement between first and second positions relative to the outer casing, the body including a coupling mechanism for contact with a power supply of the rack assembly when the shelf is mounted in the rack assembly, wherein the body is moveable relative to the outer casing between the first position in which the coupling mechanism is extended beyond the outer casing for electrical connection with the power supply when the shelf is mounted in the rack assembly and the second position in which the coupling mechanism is positioned entirely within the outer casing.

2. The power connector of claim 1, further comprising a biasing mechanism coupled to the body, the biasing mechanism arranged to bias the body towards the first position.

3. The power connector of claim 2, wherein the biasing mechanism is a compression spring positioned between the body and the outer casing.

4. The power connector of claim 2, further comprising an actuator, wherein the actuator includes a button configured to be depressed to allow the biasing mechanism to move the body from the second position toward the first position.

5. The power connector of claim 1, further comprising a biasing mechanism coupled to the body, the biasing mechanism arranged to bias the body towards the second position.

6. The power connector of claim 1, wherein the coupling mechanism includes a first contact and a second contact each configured to contact the power supply, and wherein the first contact is arranged to contact the power supply before the second contact contacts the power supply.

7. The power connector of claim 6, wherein the first contact is arranged to initiate current flow through a high impedance path, and wherein the second contact is arranged to facilitate an additional current flow through a lower impedance path.

8. The power connector of claim 1, wherein the body includes a ramp having an inclined surface for contacting a rail of the rack assembly to move the body from the first position to the second position.

9. The power connector of claim 1, further comprising an actuator operable to move the body from the first position to the second position.

10. The power connector of claim 1, further comprising an actuator operable to move the body from the second position to the first position.

11. The power connector of claim 1, wherein in the first position the power connector is extended into a sweep of a rail of the shelf which selectively couples the outer casing to the shelf.

12. The power connector of claim 1, wherein in the first position the power connector does not extend within a sweep of a rail of the shelf which selectively couples the outer casing to the shelf.

13. A shelf for mounting in a rack assembly, the shelf comprising:
  a power connector comprising:
    an outer casing fixedly coupled to the shelf, and
    a body mounted with the outer casing for movement relative to the outer casing between first and second positions, the body including a coupling mechanism for contact with a power supply of the rack assembly when the shelf is mounted in the rack assembly, wherein the body is moveable between the first position in which the coupling mechanism is extended beyond the outer casing for electrical connection with the power supply when the shelf is mounted in the rack assembly and the second position in which the coupling mechanism is retracted within the outer casing.

14. The shelf of claim 13, further comprising a biasing mechanism coupled to the body, the biasing mechanism arranged to bias the body towards the first position.

15. The shelf of claim 14, wherein the biasing mechanism is a compression spring positioned between the body and the outer casing.

16. The shelf of claim 14, further comprising an actuator, wherein the actuator includes a button configured to be depressed to allow the biasing mechanism to move the body from the second position toward the first position.

17. The shelf of claim 13, further comprising a biasing mechanism coupled to the body, the biasing mechanism arranged to bias the body towards the second position.

18. The shelf of claim 13, wherein the coupling mechanism includes a first contact and a second contact each configured to contact the power supply, and wherein the first contact is arranged to contact the power supply before the second contact contacts the power supply.

19. The shelf of claim 18, wherein the first contact is arranged to initiate current flow through a high impedance path, and wherein the second contact is arranged to facilitate an additional current flow through a lower impedance path.

20. The shelf of claim 13, wherein the body includes a ramp having an inclined surface for contacting a rail of the rack assembly to move the body from the first position to the second position.

21. The shelf of claim 13, further comprising an actuator operable to move the body from the first position to the second position.

22. The shelf of claim 13, further comprising an actuator operable to move the body from the second position to the first position.

23. The shelf of claim 13, wherein in the first position the power connector is extended into a sweep of a rail of the shelf which fixedly couples the outer casing to the shelf.

24. The shelf of claim 13, wherein in the first position the power connector does not extend within a sweep of a rail of the shelf which fixedly couples the outer casing to the shelf.

* * * * *